United States Patent
Petrenko et al.

(10) Patent No.: US 9,705,425 B2
(45) Date of Patent: Jul. 11, 2017

(54) PIEZOELECTRIC LINEAR MOTOR

(71) Applicant: DISCOVERY TECHNOLOGY INTERNATIONAL, INC., Sarasota, FL (US)

(72) Inventors: Serhiy Petrenko, Kiev (UA); Viacheslav Lavrinenko, Kiev (UA); Valentin R. Zhelyaskov, Sarasota, FL (US)

(73) Assignee: Discovery Technology International, Inc., Sasasota, FL (US)

( * ) Notice: Subject to any disclaimer, the term of this patent is extended or adjusted under 35 U.S.C. 154(b) by 238 days.

(21) Appl. No.: 13/934,373

(22) Filed: Jul. 3, 2013

(65) Prior Publication Data

US 2014/0015376 A1    Jan. 16, 2014

Related U.S. Application Data

(60) Provisional application No. 61/667,573, filed on Jul. 3, 2012.

(51) Int. Cl.
*H02N 2/00* (2006.01)
*H01L 41/09* (2006.01)
(Continued)

(52) U.S. Cl.
CPC ......... *H02N 2/0095* (2013.01); *H01L 41/094* (2013.01); *H01L 41/0986* (2013.01);
(Continued)

(58) Field of Classification Search
CPC .......... H02N 2/02; H02N 2/026; H02N 2/043; H02N 2/04
(Continued)

(56) References Cited

U.S. PATENT DOCUMENTS 5,453,653 A * 9/1995 Zumeris ................. 310/323.16
6,121,717 A   9/2000 Diefenbach et al.
(Continued)

OTHER PUBLICATIONS

International Preliminary Report on Patentability dated Jan. 6, 2015 for International (PCT) Application No. PCT/US2013/049316.

*Primary Examiner* — Derek Rosenau
(74) *Attorney, Agent, or Firm* — Fox Rothschild LLP; Robert J. Sacco; Carol E. Thorstad-Forsyth

(57) ABSTRACT

A piezoelectric motor with improved efficiency and improved specific power is disclosed. The piezoelectric motor has two frictionally engaged components mounted in such a way that they can move relative to each other. One component is a piezoelectric element in the form of a rectangular plate with metal coatings on its main planar surfaces. This component defines electrodes, where either some or all of the electrodes have leads for connection to a source of alternating voltage. The piezoelectric element is pressed by either its peripheral surfaces or by some parts of its peripheral surfaces at least by one of its sides or a section of one of its side against a cylindrical or planar surface of the other frictionally engaged component. The shape of the piezoelectric element, the arrangement and the number of the electrodes are configured to satisfy the condition of resonant excitation in the piezoelement of the first order mode of bending vibration along the length in the plane of the piezoelement during operation of the motor in one direction, and resonant excitation of the first order mode of longitudinal vibrations along the length during operation of the motor in the opposite direction.

13 Claims, 4 Drawing Sheets

(51) Int. Cl.
*H02N 2/02* (2006.01)
*H02N 2/10* (2006.01)

(52) U.S. Cl.
CPC ........... *H02N 2/002* (2013.01); *H02N 2/0015* (2013.01); *H02N 2/026* (2013.01); *H02N 2/103* (2013.01)

(58) Field of Classification Search
USPC ........................................ 310/323.01–323.21
See application file for complete search history.

(56) References Cited

U.S. PATENT DOCUMENTS

| | | |
|---|---|---|
| 6,806,620 B1 | 10/2004 | Wischnewskiy |
| 7,075,211 B1 * | 7/2006 | Ganor et al. .................. 310/317 |
| 7,922,385 B2 * | 4/2011 | Nagao ...................... 310/323.06 |
| 2003/0052573 A1 | 3/2003 | Wischnewskiy |
| 2009/0001853 A1 | 1/2009 | Adachi et al. |
| 2010/0066205 A1 * | 3/2010 | Higashionji et al. .... 310/323.02 |
| 2010/0084945 A1 * | 4/2010 | Eshed et al. ............. 310/323.02 |
| 2011/0025169 A1 | 2/2011 | Haussecker et al. |

* cited by examiner

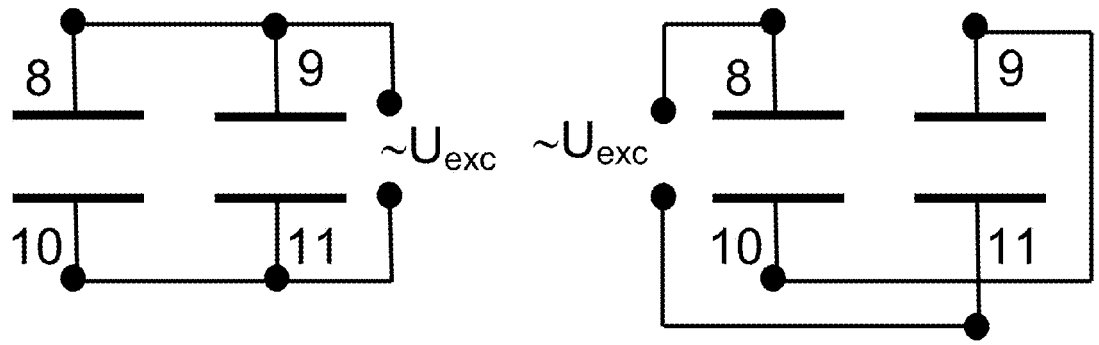
FIG. 5A                          FIG. 5B
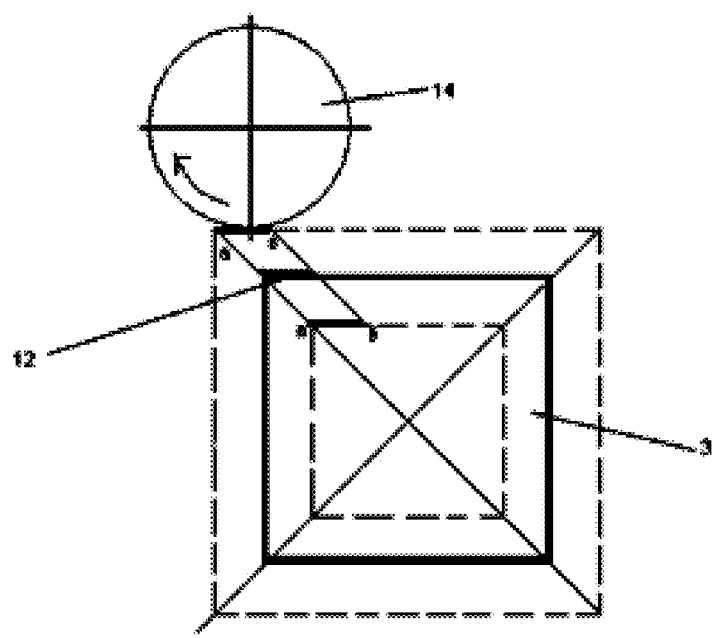
FIG. 6

PIEZOELECTRIC LINEAR MOTOR

CROSS-REFERENCE TO A RELATED APPLICATION

This application claims the benefit under 35 U.S.C. §119 (e) of U.S. Provisional Application No. 61/667,573 filed on Jul. 3, 2012, the content of which is incorporated herein in its entirety.

FIELD OF THE INVENTION

The invention relates to ultrasonic piezoelectric motors based on conversion of electrical energy into mechanical vibrational energy with subsequent conversion of this energy at a frictional contact into either rotation of a rotor or linear displacement of a carriage. Motors of this kind can be utilized in diverse fields of science and technology (e.g. medicine, automation, computer technology, aviation, space technology, motor vehicles, toys, and the like).

BACKGROUND

The piezoelectrical effect is best described as the ability of some materials, such as piezo ceramics, to generate an electrical charge in response to a mechanical force, for example, being squeezed or pressed. The piezoelectric effect is reversible, in that materials exhibiting the effect also exhibit the reverse and/or inverse piezoelectric effect. Thus they change shape or size when excited by an electric charge. Although, the inverse piezoelectric effect has been well known and studied for some years, it is only relatively recently that commercial devices incorporating piezo technology have begun to find practical applications in everyday devices.

One major use of the piezo technology is in the development of piezoelectric motors. Examples of such piezoelectric motors are disclosed in U.S. Pat. Nos. 6,765,335, 7,973,451, 7,816,839, 7,737,605, and 7,211,919, the content of which is incorporated herein in their entirety. These types of motors are based on the frictional interaction of two parts, namely a rotor and stator, where one of these two parts is a piezoelectric element. As illustrated in U.S. Pat. No. 6,765,335, the piezoelectric element (or piezoelement) can be a rectangular plate with metal coatings on its main planar surfaces that has electrodes with leads connected to AC voltage excitation source. The piezoelement is pressed by a section of one of its sides against either a cylindrical rotor or a planar carriage surface. Specifically, a contact site on the piezoelement is pressed against a rotor or a carriage surface. The contact site is defined as the section of the surface area of the piezoelement that is in frictional engagement with the rotor or the carriage. The contact site executes elliptical motion to convert vibrational motion of the piezoelement into unidirectional motion of the rotor or of the carriage. The shape and arrangement of the electrodes are chosen to simultaneously excite higher-order modes of longitudinal vibration (the $2^{nd}$, $4^{th}$, etc.) along the length and the first-order mode of longitudinal vibration across the width of the piezoelement. The superposition of both vibrations gives rise to the elliptical motion of the contact site.

Although these piezoelectric motors have been promising, there are still certain drawbacks in utilizing elliptical motion of the piezoelement at the contact site. One such drawback is that one of the modes of vibration, i.e., the first order mode of longitudinal vibration across the width, produces a solely alternating motion of pressing one part of the motor against another, e.g. stator against rotor. As a result the energy is not transferred to the load, decreasing the efficiency of converting electric energy into mechanical energy. Consequently, the specific power and overall efficiency of the motor is unavoidably diminished.

In view of the foregoing, it would be desirable to provide a solution which overcomes the above-described inadequacies and shortcomings in the design of piezoelectric motors with improved efficiency and specific power.

SUMMARY

Having recognized the shortcomings of the prior art, as one embodiment, a piezoelectric motor is provided with improved efficiency and improved specific power while substantially reducing the dimensions of the piezoelectric motor. In particular, in this embodiment, two frictionally engaged components are mounted to allow movement relative to each other. One of the engaged components has a piezoelement in the form of a rectangular plate with metal coatings on its main planar surfaces. The metal coatings form a plurality of electrode elements. Preferably, two symmetrically arranged metal coatings, forming electrodes with leads, are applied onto the two main planes of the piezoelectric plate.

Some or all of the electrodes have leads for connection to a source of alternating voltage. The piezoelectric element is pressed by either its peripheral surfaces or by one or more sections of its peripheral surfaces (at least by one of its sides or a portion of its side) against a cylindrical or planar surface of the other frictionally engaged component. In a preferred embodiment, the ratio of length (L) to width (B) of the main plane of the rectangular resonator within the piezoelement is about 1.0 to about 1.2. Without being bound by theory, it is believed that as the ratio increases, the efficiency of the piezoelectric motor decreases by as much as 30% (i.e., 1.0→1.2).

In one embodiment, the shape of the piezoelement, the arrangement and the number of the electrodes are not particularly limited and are devised to satisfy the condition for resonant excitation in the piezoelement of the first order mode of bending vibration along the length in the main plane of the piezoelement during operation of the motor in one direction. In another embodiment, the electrodes within the piezoelement have the shape and arrangement that are devised to satisfy the condition of resonant excitation of the first order mode of longitudinal vibration along the length of the element for operation of the motor in the opposite direction.

The present invention is also directed to a method for converting the piezoelement vibration into unidirectional motion that does not rely on an elliptical motion of the contact site between the static and movable components of the motor. In particular, the area of the piezo plate that is in frictional engagement with the moveable part of the motor is made to move either parallel or quasi-parallel in respect to itself, while simultaneously moving along the length of the piezoelement, i.e. that the surface of the plate in contact with the rotor slides along in a direction parallel to the opposite surface of the piezo plate (parallel or quasi-parallel displacement). As described herein, quasi-parallel displacement refers to a movement very close to parallel in the typical nano/micro range of movement during vibrations of the piezoelement. The shape, the arrangement and the number of electrodes are devised to satisfy the conditions for resonant excitation in the piezoelement of the first order mode of bending vibrations in the plane of piezoelement when the motor is energized.

It is believed that the foregoing method for converting the piezoelement vibration into unidirectional motion is most suitable for uni-directional motors, where the direction of rotation is determined by the relative position of the vibrating pusher and the rotor. However, if the rectangular piezoelement has the main surface of the plate within the L/B ratio of about 1.0-1.2 range and includes electrodes whose shape and arrangement are devised to satisfy the conditions for resonance excitation in the piezoelement of the first order mode of longitudinal vibration along the length of the resonator, the motor becomes bi-directional (reversible). That is, bending vibrations are excited to generate motion in one direction, whereas longitudinal vibrations are excited in order to generate motion in the opposite direction. This is achieved by using two different sources of alternating (AC) voltage with different frequencies for each direction of movement.

To facilitate excitation of only one type of vibration, either bending or longitudinal vibration, two symmetrically arranged metal electrodes are provided. The metal electrodes have leads to connect the electrodes to sources of alternating voltage. The electrodes are deposited on each of the main surfaces of the piezoelectric plate. The piezoelement is polarized normal to these surfaces. Excitation of either bending or longitudinal vibrations is achieved by switching over these leads appropriately to selectively determine which electrodes are excited.

BRIEF DESCRIPTION OF THE DRAWINGS

FIG. 5A is a schematic drawing showing a circuit diagram of the electrode connections for excitation of longitudinal vibrations (Type 3 connection).

FIG. 5B is a schematic drawing showing a circuit diagram of the electrode connections for excitation of longitudinal vibrations (Type 4 connection).

FIG. 6 is a schematic diagram of the movement trajectory of points on the contact area during resonance of longitudinal vibrations.

DETAILED DESCRIPTION

Figure 1:
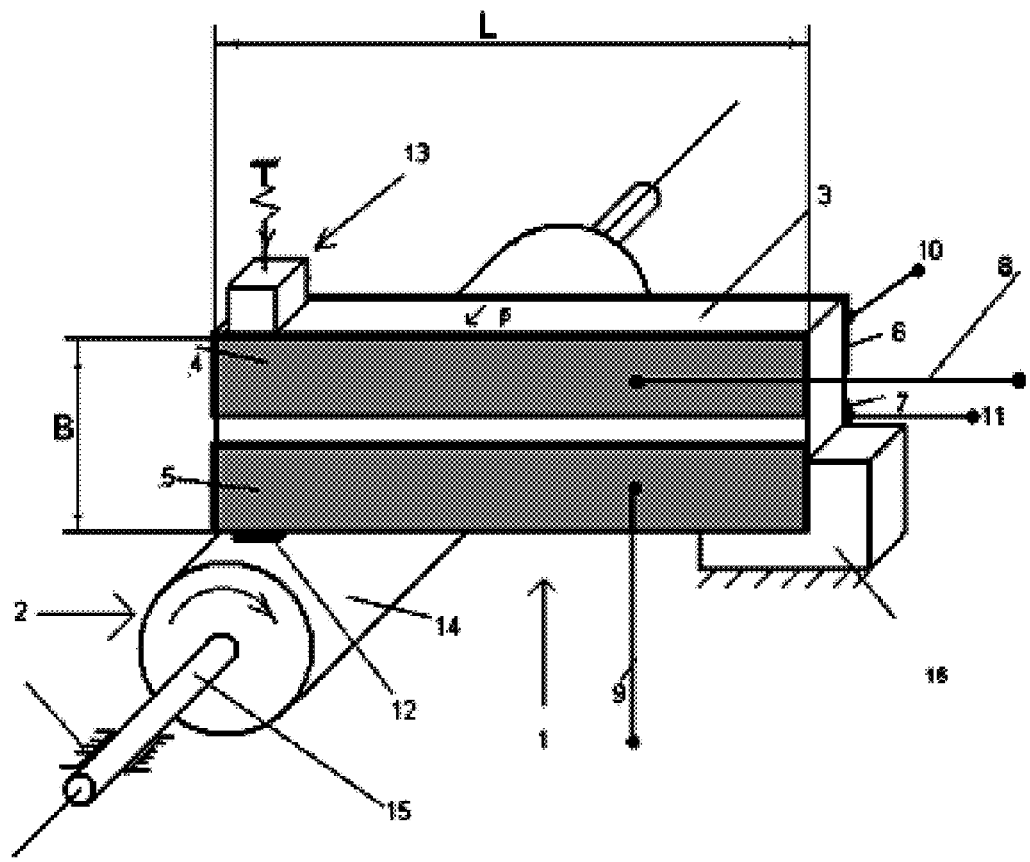
FIG. 1 is a schematic drawing of one exemplary embodiment of the piezoelectric motor having a unidirectional rotation.

The present objectives, features and advantages will be apparent from the following detailed description of the invention, which is to be read in conjunction with the accompanying drawings. The drawings are not drawn to scale and they are provided merely to illustrate the instant invention. The scope of the invention will be pointed out in the claims. The drawings, taken in conjunction with the subsequent description, are presented to enable one of ordinary skill in the art to make and use the invention and to incorporate it in the context of particular applications. It should be understood, however, that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

FIGURE ELEMENTS

1, 2: Frictionally interacting parts of the motor
3 Piezoelement
4, 5, 6, 7 Electrodes
8, 9, 10, 11 Leads of the electrodes
12 Contact area
13 Pressing device
14 Rotor
15 Shaft
16 Sound-insulating mounting gasket
17 Flexible steel plate
18 Planar guiding surfaces.

This invention is based on the development of a piezoelectric motor and a method for converting the piezoelement vibration into unidirectional motion that does not rely on an elliptical motion of the contact site between the static and movable components of the motor. Referring now to FIG. 1, in one embodiment, a piezoelectric motor comprises two frictionally interacting components 1 and 2 mounted in a way to allow displacement of each component relative to each other. Component 1 includes a piezoelement 3, which is a rectangular plate made from piezoelectric material (e.g., piezo ceramics, piezo crystals) with metal deposits on its main planar surfaces defining electrodes 4, 5, 6 and 7 with their respective leads 8, 9, 10 and 11. At the opposing end of the piezoelement 3 orthogonal to the main surface and away from the leads is a contact area 12. The contact area 12 is pressed either directly or via a wear-resistant gasket against the cylindrical surface of rotor 14 on shaft 15 by a pressing element 13 (e.g. a spring). The shaft 15 is preferably supported by bearings (not shown). The piezoelement 3 is secured to a base (not shown) by a sound-insulating gasket 16.

Figure 2A:
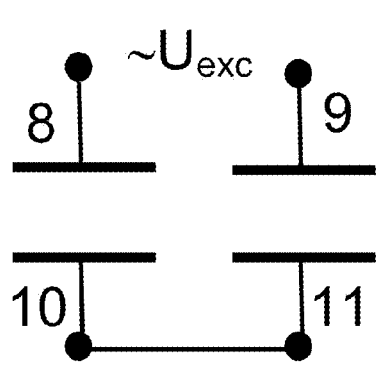
FIG. 2A is a schematic drawing showing a circuit diagram of the electrode connections for excitation of bending vibrations (Type 1 connection).
Figure 2B:
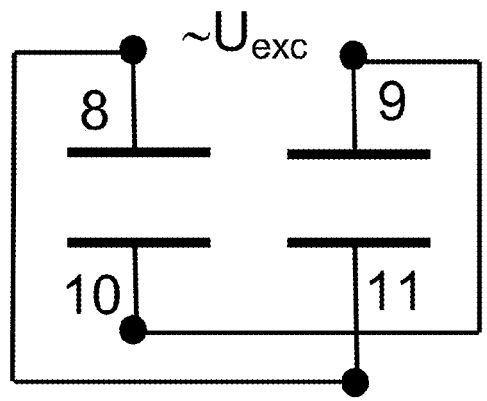
FIG. 2B is a schematic drawing showing a circuit diagram of the electrode connections for excitation of bending vibrations (Type 2 connection).

In one embodiment, the rotation of the shaft 15 is produced by applying an alternating current (AC) to the piezoelement 3 via the electrode leads at a frequency corresponding to the resonance frequency of excitation of bending vibrations. The current can be applied using either the circuit setup/configuration illustrated in FIG. 2A or FIG. 2B.

Figure 3:
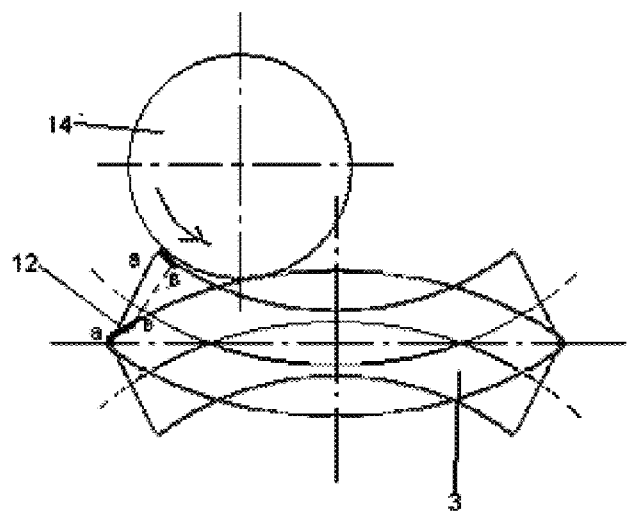
FIG. 3 is a schematic diagram of the movement trajectory of points on the contact area during resonance of bending vibrations in the piezoelectric motor illustrated in FIG. 1.

As illustrated in FIG. 3, during the resonance excitation of bending vibrations the displacement of the contact area 12 can be best exemplified by the trajectory of motion of points "a" and "b". The amplitude of the piezoelement 3 bending shown in FIG. 3 has been exaggerated to allow those skilled in the art easier visualization of the displacement of the contact area during the vibration. In practice, however, for typical nano/micro amplitude of vibration, the movement of the contact area 12 is near parallel and, as such, is regarded as a quasi-parallel displacement, i.e. the movement of the contact area 12 is near parallel to the long side of the piezoelement so that it moves approximately tangential to the circumference of the rotor. Quasi-parallel movement is defined as movement when the angle between the two lines is small. Small angles are defined as sin x=x where the first term in the Taylor series is considered. This is valid when the angle is less than 0.244 rad or 14 degrees.

Figure 4:
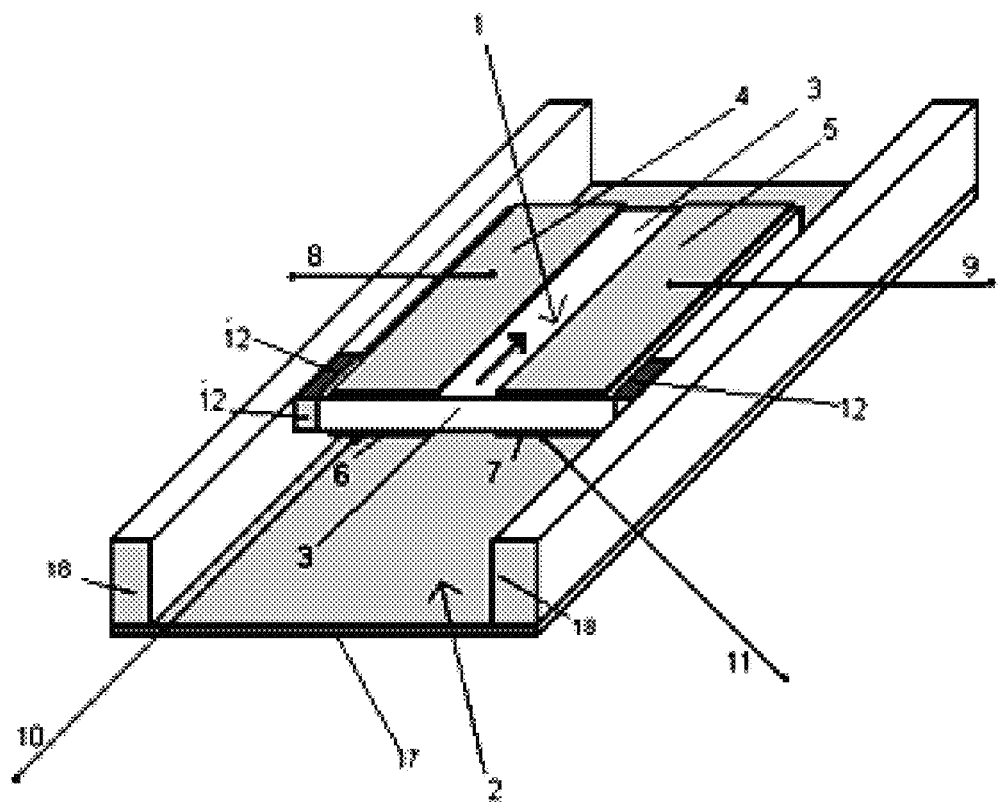
FIG. 4 is a schematic drawing of one exemplary embodiment of the linear piezoelectric motor.

In another embodiment illustrated in FIG. 4, the contact areas 12 of the linear piezoelectric motor is placed on the opposite minor/narrow sides of the piezoelement 3 and are pressed against the planar guide surfaces 18 by an elastic plate 17. In one exemplary embodiment, the plate 17 can be formed of a metal such as spring steel. To produce the required motion, the linear motor is connected to one of two sources of AC current. The current is applied either in accordance with a circuit configuration shown in FIG. 2A or FIG. 2B to excite bending mode vibrations, or in accordance with a circuit configuration shown in FIG. 5A or FIG. 5B to excite longitudinal mode vibrations. In one embodiment, the AC current for excitation of longitudinal mode vibration is preferably made by a plurality of rectangular pulses having a root mean square (RMS) amplitude of about 20-50 V and the frequency (f) defined by f=c/2 L, where c is the speed of propagation of sound in the piezoelectric material and L is the length of the piezoelectric resonator. In another embodiment, the AC current for excitation of bending mode vibration is preferably made by a plurality of rectangular pulses having an RMS amplitude of about 20-50 V and the frequency (f) defined by f=c/3.46 L. FIG. 6 shows the trajectory of motion of contact points "a" and "b" of the contact areas 12 in the case when the contact site is spring loaded against a rotor. The trajectory of displacement of contact points "a" and "b" is parallel in the nano/micro range of vibrations. The trajectory is identical if the contact site is spring loaded against a linear stage.

The planar rectangular piezoelement 3 has four lateral sides and each side can accommodate two contact areas. For example, a maximum of eight rotors can be connected simultaneously to the piezoelement 3 if the attachment of the motor is implemented in the middle of the resonator, which is the point of minimum amplitude of vibration. In one exemplary embodiment, the spring loading of each rotor could be implemented by spring loading of its shaft in respect to the resonator. If needed, the multiple rotors could be interconnected by gears to integrate the motion and multiply the output torque.

The present invention is also directed to a method for converting the piezoelement vibration into unidirectional motion that does not rely on an elliptical motion of the contact site between the static and movable components of the motor.

In particular, the disclosed piezoelectric motor operates as follows. In one embodiment, the AC current source is connected via the leads 8 and 9 to the electrodes 4 and 5, respectively, based on the circuit arrangement shown in FIG. 2A (i.e., leads 10 and 11 shorted). By passing the AC current at a frequency corresponding to the resonant frequency of bending vibrations, the section of the piezoelement 3 between electrodes 4 and 6 compresses instantaneously along the length L. At the same time the section between electrodes 5 and 7 stretches along the length L. As a result the piezoelement 3 bends across the width (B). When the polarity of the AC current is reversed during the vibrational period, the bend forms in the opposite direction. In a preferred embodiment, the amplitude of bending deformation can be amplified when the length (L) of the piezoelement 3 is equal to half of the wavelength (½λ) of the frequency of the vibrations along its length. This corresponds to a resonance excitation of the first order mode of bending vibrations.

As the piezoelement 3 vibrates being pressed at its contact area 12 by the element 13 against the rotor 14, the rotor 14 rotates and the shaft 15 transmits the rotation to the load. In another embodiment, a similar effect can be achieved using the current lead connection arrangement of FIG. 2B, which is believed to be more effective for thicker piezoelements. During the excitation of bending vibrations in a rectangular resonator the contact points "a" and "b" of the contact area 12 (see FIG. 3) and the contact area 12 as a whole is subjected to both longitudinal and transverse displacements. The vibrations of only few hundreds nanometers in amplitude lead to quasi-parallel displacement of the contact area 12, which in turn leads to quasi-parallel pushing of the rotor. The quasi-parallel pushing effect results in left-hand (counter-clockwise) rotation of the rotor (see FIG. 3).

In the square resonator shown in FIG. 6 using either of the connection schematics of FIG. 5A or FIG. 5B, a strictly parallel displacement of the contact area 12 can be obtained based on the longitudinal vibrations where the points "a" and "b" move only in a direction parallel to the diagonal of the square. This is due to the simultaneous excitation of the same longitudinal vibrational mode along the two equal-length orthogonal sides of the square resonator, thereby synchronizing the movement of all points in the orthogonal direction. As a result, in-phase increase or decrease of the width and length can be achieved. The parallel pushing action applied to the rotor, therefore, would result in right-hand (clockwise) rotation of the rotor (see FIG. 6).

In a preferred embodiment, the ratio of the sides of the rectangular piezoresonator (length to width) is about 1.0 to about 1.2. Without being bound by theory, it is believed that if the ratio of the sides of the rectangular piezoresonator (length to width) is outside the 1.0-1.2 range, the performance of the motor would decline sharply. Specifically, the increase in the length of the plate only, due to resonance excitation, would reduce its width. As a result, the parallel displacement of the contact area would reverse its direction. The direction of rotation would be identical to the direction of rotation caused by the bending mode excitation. The reason for the different resultant movement of the contact site between the square and the rectangular resonator is that in the latter the resonance conditions are not fulfilled simultaneously for both orthogonal directions. That is, both sides are not expanding or contracting synchronously. Excitation of square resonator is used to reverse the direction of rotation. Thus the same electrodes can be used for excitation of either bending or longitudinal vibrations. To excite longitudinal vibrations, the leads of the electrodes have to be connected in accordance with either configuration scheme depicted in FIG. 5A or FIG. 5B. The difference between these two configurations is purely based the input impedance of the motor, which is relevant only to the requirements for the AC current source. The same observation applies equally to the use of the configurations scheme depicted in FIG. 2A and FIG. 2B used for excitation of bending vibrations.

The method for converting the piezoelement vibration into unidirectional motion can also allow reversible linear motion. For example, in the piezoelectric motor illustrated in FIG. 4 the piezoelement with approximately square shape is set to allow free movement forward and backward between two guides 18 pressed together by the flat spring 17. Either of the resonator 1 or spring loaded base 2 can serve as a stator if it is fixed to the motor body/frame. With excitation of longitudinal vibrations in the piezoelement using the connection configurations of FIG. 5A or FIG. 5B, if the elements 17 and 18 are held as stator, the piezoelement can move linearly in the direction of the arrow propelled along the guides 18 by the contact areas 12. With excitation of first order bending vibrations (configuration of either FIG. 2A or FIG. 2B) the piezoelement can move in the opposite direction.

In the piezoelectric motors of the prior art, the converting properties of frictional contact (i.e. conversion from rotational movement of contact points or area of stator to rotational movement of rotor or linear movement of translation stage) conventionally involve interaction of two primary orthogonal oscillations (e.g. longitudinal-longitudinal, longitudinal-bending, bending-bending etc.). As a result, the contact points move along elliptical paths (the oar principle). A change in the polarity of one primary oscillation reverses the motion. In contrast, only one mode of vibration is excited to cause a movement in the present invention. With comparably large displacements simultaneously in longitudinal and transverse directions, effect of conversion of mechanical vibration of the piezoresonator into linear displacement of the moving part would take place as well. That is, the formation of an elliptical movement of the contact area between the piezoelement and moving part is not necessary. Such conversion into linear movement can be observed if either the first order mode of bending or longitudinal vibration is excited. Contact area 12, while moving approximately parallel to itself and at an angle (approximately 45°) with respect to the moving (or rotating) part plane of contact, would cause displacement of component 1 relative to component 2, which are pressed together by element 13.

In the piezoelectric motor described herein, the entire volume of the piezoelement is utilized, which ensures that greater power is transferred to the load. As a result, for the same power as supplied by the motor of the prior art, the size of the piezoresonator and the motor can be decreased. This decrease leads to a lowered motor cost, which in mass-production is mostly defined by the cost of the piezoelement. Because both directions of movement for this motor work using a single mode resonance excitation, the linear motors can be powered using a tuned power source operating at a frequency in resonance with the piezoelement's required resonance frequency. This provides for motor performance that is stable with variation in load and environment. These conclusions were supported by actual testing data. Exemplary linear motors using the above described principles have been manufactured, with starting forces from 1 to 30 N.

Example 1

Figure 7:
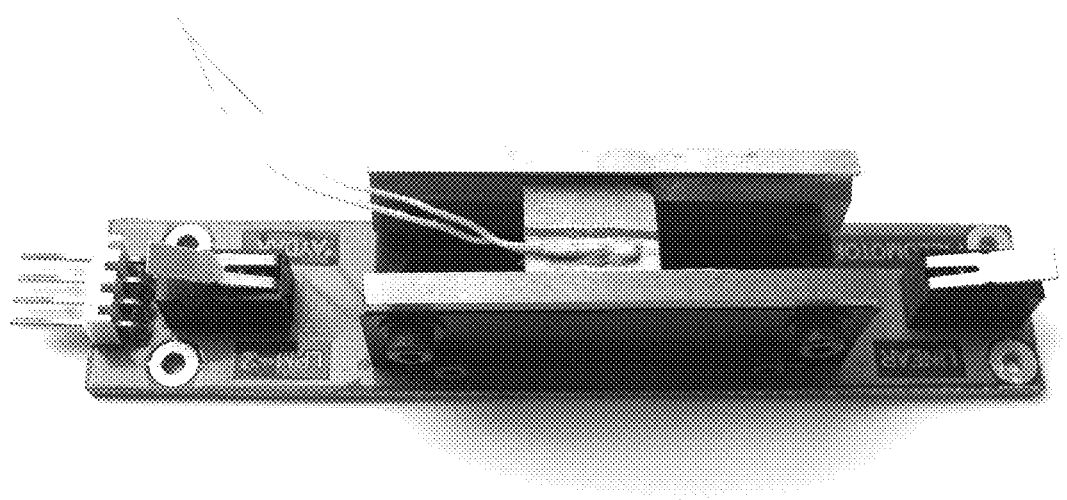
FIG. 7 is a photo of an exemplary bidirectional square piezoelectric motor prototype.

The present invention may be illustrated by way of an exemplary prototype produced and illustrated in FIG. 7 with the following characteristics

| | |
|---|---|
| Max. Push/Pull Force | 2N |
| Self-braking Force | 3N |
| Max speed | 0.2 m/s |
| Travel range | 20 mm |
| Min linear step | 100 nm |
| Consumed power | 1 W |
| Motor Weight | 20 g |

In this prototype, the bidirectional 'square' motor shows improved efficiency and improved specific power while substantially reducing the dimensions of the piezoelectric motor. In particular, the disclosed prototype of the piezoelectric motor consumes about ½ of the power of the linear piezoelectric motors of the prior art for equal force of 2 N. It is believed that the motor weight of such motor can be decreased more than 50% while keeping the rest of the specifications unchanged.

All publications and patents mentioned in the above specification are herein incorporated by reference in their entireties. Various modifications and variations of the described materials and methods will be apparent to those skilled in the art without departing from the scope and spirit of the invention. Although the disclosure has been described in connection with specific preferred embodiments, it should be understood that the invention as claimed should not be unduly limited to such specific embodiments. Indeed, those skilled in the art will recognize, or be able to ascertain using the teaching herein and no more than routine experimentation, many equivalents to the specific embodiments of the invention described herein. Such equivalents are intended to be encompassed by the following claims.

The invention claimed is:
1. A piezoelectric motor, comprising:
a base;
at least two frictionally engaged components that can move relative to each other, mounted within the base, for converting electric current into motion;
one of the two frictionally engaged components comprises a piezoelectric element in the form of a rectangular plate having a length to width ratio of 1.0 to 1.2, with metal coatings on its opposing main planar surfaces that define one or more electrodes, at least one having one or more leads for connection to a source of an alternating current;
said piezoelectric element pressed against a cylindrical or planar surface of the other frictionally engaged component whereby a contact area of the piezoelectric element frictionally engages the cylindrical or planar surface;
wherein the shape of the piezoelectric element, an arrangement and a number of the electrodes, and the source of the alternating current, are configured to satisfy a condition of resonant excitation in the piezoelectric element, wherein:
a first configuration, which provides movement of a movable one of the frictionally engaged components in a first direction, facilitates the excitation of only a single mode of vibration in the piezoelectric element, said single mode comprising a first order mode of bending vibration excited along a length direction of the piezoelectric element and in a plane of the piezoelectric element, and
a second configuration, which provides movement of the movable one of the frictionally engaged components in a second direction opposite the first direction, facilitates the excitation of only a single mode of vibration in the piezoelectric element, said single mode comprising a first order mode of longitudinal vibrations of the piezoelectric element excited along the length during operation of the piezoelectric motor.

2. The piezoelectric motor according to claim 1, wherein the piezoelectric element further comprises two symmetrically arranged electrodes with their leads applied onto each main plane of the rectangular plate, with the piezoelectric element being polarized normally to the main planes.

3. The piezoelectric motor according to claim 2, wherein for excitation of bending vibrations the leads of two symmetrically arranged electrodes on one main plane of the rectangular plate are interconnected to each other and the leads of the two symmetrically arranged electrodes on an opposing main plane of the rectangular plate are connected to a source of an alternating current.

4. The piezoelectric motor according to claim 2, wherein for excitation of bending vibrations the leads of two electrodes on the opposing planes of the rectangular plate are interconnected in a diametrically opposite configuration.

5. The piezoelectric motor according to claim 1, wherein the piezoelectric element further comprises two symmetrically arranged electrodes with their leads applied onto each main plane of the rectangular plate, with the piezoelectric element being polarized normally to these planes.

6. The piezoelectric motor according to claim 1, wherein the amplitude of the piezoelectric element bending is on the order of nanometers.

7. The piezoelectric motor according to claim 1, wherein the two frictionally engaged components undergo a parallel displacement during a vibration.

8. The piezoelectric motor according to claim 7, wherein the AC current for generation of vibrations is made by a plurality of rectangular pulses having a root mean square (RMS) amplitude of about 20-50 V.

9. The piezoelectric motor according to claim 8, wherein for excitation of longitudinal mode vibrations the frequency (f) of the AC current is c/2 L, where c is the speed of propagation of sound in the piezoelectric material and L is the length of a piezoelectric element.

10. The piezoelectric motor according to claim 8, wherein for excitation of bending mode vibrations the frequency (f) of the AC current is c/3.46 L, where c is the speed of propagation of sound in the piezoelectric material and L is the length of a piezoelectric element.

11. The piezoelectric motor according to claim 1, wherein the piezoelectric element is made from a piezo ceramics.

12. The piezoelectric motor according to claim 1, wherein the condition of resonant excitation in the piezoelectric element which facilitates movement of the piezoelectric element in the first direction corresponds to a movement of the contact area in a direction which is nearly parallel to the length direction of the piezoelectric element.

13. The piezoelectric motor according to claim 12, wherein the condition of resonant excitation in the piezoelectric element which facilitates movement of the piezoelectric element in the second direction corresponds to a movement of the contact area in a direction which is nearly parallel to the length direction of the piezoelectric element.

* * * * *